United States Patent [19]

Kowshik

[11] Patent Number: 5,587,603
[45] Date of Patent: Dec. 24, 1996

[54] TWO-TRANSISTOR ZERO-POWER ELECTRICALLY-ALTERABLE NON-VOLATILE LATCH

[75] Inventor: Vikram Kowshik, Fremont, Calif.

[73] Assignee: Actel Corporation, Sunnyvale, Calif.

[21] Appl. No.: 369,760

[22] Filed: Jan. 6, 1995

[51] Int. Cl.⁶ .................................... H01L 29/788
[52] U.S. Cl. ................ 257/316; 257/315; 257/320; 257/321
[58] Field of Search .......................... 257/300, 303, 257/316, 318, 320, 337, 334, 315, 321

[56] References Cited

U.S. PATENT DOCUMENTS

| | | | |
|---|---|---|---|
| 4,375,086 | 2/1983 | van Velthoven | 365/149 |
| 4,495,427 | 1/1985 | Cartwright | 307/469 |
| 4,617,479 | 10/1986 | Hartmann et al. | 307/465 |
| 4,622,656 | 11/1986 | Kamiya et al. | 365/185 |
| 4,742,492 | 5/1988 | Smayling et al. | 365/218 |
| 4,822,753 | 4/1989 | Pintchovski et al. | 437/192 |
| 4,829,203 | 5/1989 | Ashmore, Jr. | 307/469 |
| 4,851,361 | 7/1989 | Schumann et al. | 437/30 |
| 4,878,199 | 10/1989 | Toshiba et al. | 365/185 |
| 4,885,719 | 12/1989 | Brahmbhatt | 365/181 |
| 5,247,478 | 9/1993 | Guota et al. | 365/185 |
| 5,380,672 | 1/1995 | Yuan et al. | 257/320 |
| 5,424,985 | 6/1995 | McClure et al. | 365/194 |

FOREIGN PATENT DOCUMENTS

| | | | |
|---|---|---|---|
| 0053878 | 11/1981 | European Pat. Off. | 11/34 |
| 0515039 | 4/1992 | European Pat. Off. | 16/4 |

*Primary Examiner*—Wael Fahmy
*Assistant Examiner*—Fetsum Abraham
*Attorney, Agent, or Firm*—D'Alessandro & Ritchie

[57] ABSTRACT

A two-transistor, zero-power, electrically-alterable non-volatile latch element comprises an input node, an output node, and an erase node. A P-Channel MOS transistor has a source connected to a source of first electrical potential, a drain connected to the output node, a control gate connected to the input node, and a floating gate capacitively coupled to the control gate. An N-Channel MOS transistor has a source connected to a source of second electrical potential lower than the first electrical potential, a drain connected to the output node, a control gate connected to the input node, and a floating gate capacitively coupled to the control gate and electrically connected to the floating gate of the P-Channel MOS transistor. The floating gates of the P-Channel MOS transistor and the N-Channel MOS transistor are capacitively coupled to the erase node via a tunnel dielectric.

3 Claims, 4 Drawing Sheets

TWO-TRANSISTOR ZERO-POWER ELECTRICALLY-ALTERABLE NON-VOLATILE LATCH

BACKGROUND OF THE INVENTION

1. Field of the Invention

The present invention relates to solid state switching devices. More particularly, the present invention relates to a two-transistor, zero-power, electrically-alterable non-volatile latch element. Typical environments for the present invention include using the switch to control a pass transistor for user-programmable circuit applications.

2. The Prior Art

The problem of providing non-volatile latch elements has been addressed in the prior art. Several solutions have been proposed.

U.S. Pat. No. 4,132,904 to Harrari, discloses a static-RAM-like structure employing a cross-coupled CMOS latch in which the N-Channel transistors are provided with floating gates which may be programmed to impart a desired state to the latch. While the Harrari circuit does provide a non-volatile latch which provides complementary data which can be reprogrammed, it requires high-voltage n-well structures and provides indeterminate data on first powerup. In addition, the floating gate structures are prone to the well known read-disturb phenomenon by which repeated read operations can degrade the stored data.

U.S. Pat. No. 4,300,212 to Simko discloses a non-volatile static RAM circuit. It employs a very large cell size including at least eight transistor devices, some of which are complicated semiconductor structures. U.S. Pat. No. 4,858,185 to Kowshik et al. discloses a structure employing a CMOS non-volatile latch. While the Kowshik et al. latch does provide a non-volatile latch which provides complementary data which can be reprogrammed, can assume a known state on powerup and does not require high-voltage n-well technology, it requires a very large cell size employing ten transistors as well as other structures.

It is therefore an object of the present invention to provide a non-volatile latch element which overcomes some of the shortcomings of the prior art.

Another object of the present invention is to provide a non-volatile latch element which employs a small cell size.

Another object of the present invention is to provide a non-volatile latch element which employs a minimum number of transistor devices.

A further object of the present invention is to provide a non-volatile latch element which does not require high-voltage n-well technology.

Yet another object of the present invention is to provide a non-volatile latch element which has improved read disturb immunity.

It is a further object of the present invention to provide a non-volatile latch element which assumes a known state on powerup.

BRIEF DESCRIPTION OF THE INVENTION

According to a first aspect of the present invention, a two-transistor, zero-power, electrically-alterable non-volatile latch element includes an input node, an output node, and an erase gate. A P-Channel MOS transistor has a source connected to a source of first electrical potential, a drain connected to the output node, a control gate connected to the input node, and a floating gate capacitively coupled to the control gate. An N-Channel MOS transistor has a source connected to a source of second electrical potential lower than the first electrical potential, a drain connected to the output node, a control gate connected to the input node, and a floating gate capacitively coupled to its control gate and electrically connected to the floating gate of the P-Channel MOS transistor. The floating gates of the P-Channel MOS transistor and the N-Channel MOS transistor are capacitively coupled to the erase node via a tunnel dielectric. The control gate and the erase gate may comprise regions in the substrate capacitively coupled to the floating gate or may comprise polysilicon lines capacitively coupled to the floating gate.

According to another aspect of the present invention, a MOS transistor switch may be connected to the output node of the two-transistor, zero-power, electrically-alterable non-volatile latch element of the present invention. The state of the latch controls whether the transistor is turned on or off. The drain and source of the MOS transistor switch may be connected to circuit nodes which may be selectively connected together by programming the two-transistor, zero-power, electrically-alterable non-volatile latch element.

The two-transistor, zero-power, electrically-alterable non-volatile latch element of the present invention may be fabricated using a single polysilicon gate process in which the control gate and erase nodes are formed from diffused regions in a semiconductor substrate. Alternately, the two-transistor, zero-power, electrically-alterable non-volatile latch element of the present invention may be fabricated using a double polysilicon gate process in which the control gate and erase nodes are formed from regions of the second level polysilicon layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
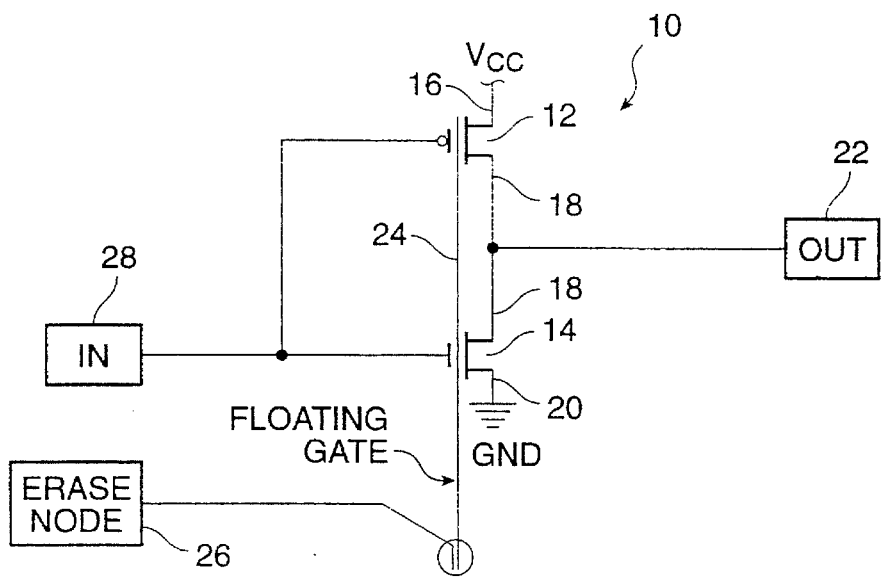
FIG. 1 is a schematic diagram of a two-transistor, zero-power, electrically-alterable non-volatile latch element according to the present invention.

Referring first to FIG. 1, a two-transistor, zero-power, electrically-alterable non-volatile latch element 10 of the present invention is seen to comprise a P-Channel MOS transistor 12 and an N-Channel MOS transistor 14 configured in the manner of a well-known inverter. The source 16 of P-Channel MOS transistor 12 is a diffused region in a semiconductor substrate and is connected to Vcc potential, the drain 18 of p-channel MOS transistor 12 is a diffused region in a semiconductor substrate and is also the drain 18 of N-Channel MOS transistor 14. The source 20 of N-Channel MOS transistor 14 is a diffused region in a semiconductor substrate and is connected to ground potential. The common drains 18 of P-Channel MOS transistor 12 and N-Channel MOS transistor 14 form an output node 22 for the two-transistor, zero-power, electrically-alterable non-volatile latch element 10.

A common floating gate 24, which may be formed from a layer of doped polysilicon as is known in the art, is associated with both P-Channel MOS transistor 12 and N-Channel MOS transistor 14. Floating gate 24 is capacitively coupled to an erase "gate" node 26 via a tunneling dielectric as is known in the art.

P-Channel MOS transistor 12 and N-Channel MOS transistor 14 share a common control "gate" node 28. Control gate node 28 is capacitively coupled to floating gate 24 and may comprise, for example, a separate diffused region in the semiconductor substrate.

The two-transistor, zero-power, electrically-alterable non-volatile latch element 10 of the present invention is stable in two states, a programmed, or "on" state, and an erased, or "off" state. The two-transistor, zero-power, electrically-alterable non-volatile latch element 10 of the present invention may be programmed by raising the common control gate node 28 of the P-Channel and N-Channel MOS transistors 12 and 14 to a programming voltage Vpp, while the erase gate node 26 is held at zero volts. The floating gate 24 is coupled high because of the capacitive coupling to the control gate node 28. If the electric field across the tunnel dielectric exceeds the minimum field required for Fowler-Nordheim tunneling, electrons will tunnel across the tunnel dielectric to the floating gate 24. The trapped electrons increase (i.e., make more positive) the threshold of the N-Channel MOS transistor 14 and decrease (i.e., make more negative) the threshold of the P-Channel MOS transistor 12. After the programming voltage is removed, the control gate node 28 is held at ground potential. The output of the latch at output node 22 will be at approximately Vcc since the N-Channel MOS transistor 14 is turned off and the P-Channel MOS transistor 12 is turned on.

To erase the two-transistor, zero-power, electrically-alterable non-volatile latch element 10 of the present invention, the control gate node 28 is held at ground potential and the erase gate node 26 is raised to Vpp. The electrical field established across the tunnel dielectric will cause electrons to tunnel out of the floating gate 24, thus making it more positive. The positive charge on the floating gate 24 decreases (i.e., makes less positive) the threshold of the N-Channel MOS transistor 14 and increases (i.e., makes more positive) the threshold of the P-Channel MOS transistor 12. After the programming voltage is removed, the control gate node 28 is held at ground potential. The output of the latch at output node 22 will be at approximately ground since the N-Channel MOS transistor 14 is turned on and the P-Channel MOS transistor 12 is turned off.

Figure 2:
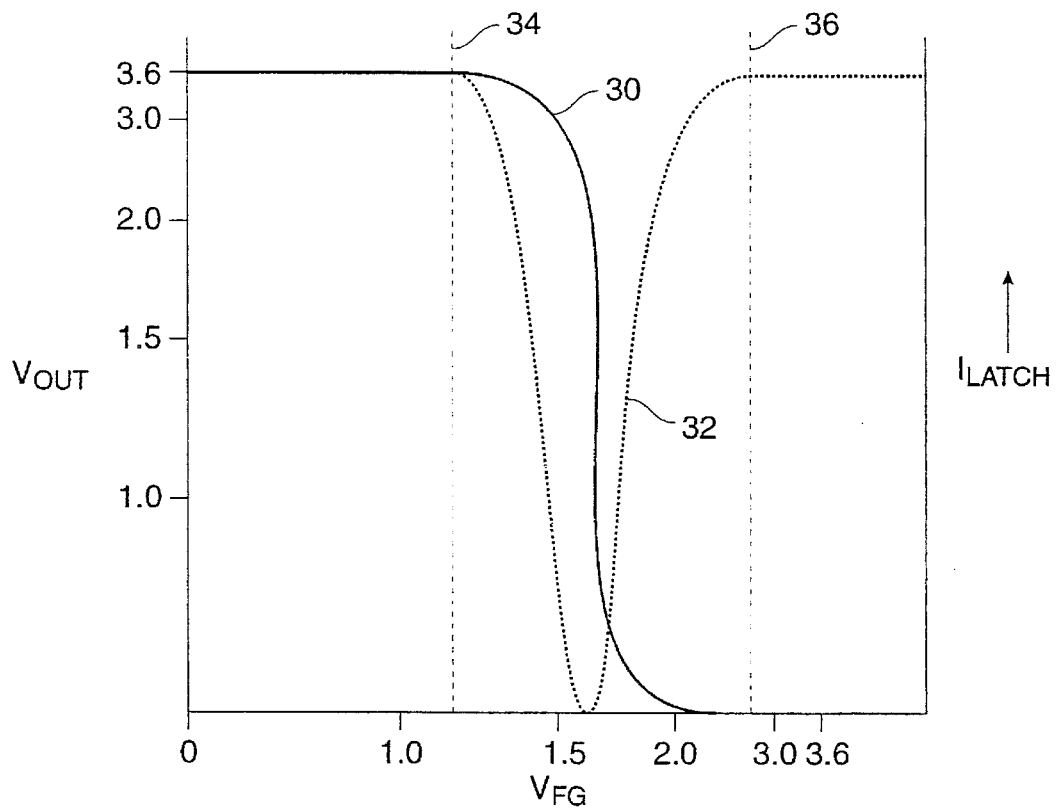
FIG. 2 is a graph showing the transfer characteristics of the two-transistor, zero-power, electrically-alterable non-volatile latch element of FIG. 1 in both its programmed and erased states.

FIG. 2 is a graph showing the transfer characteristics of the two-transistor, zero-power, electrically-alterable non-volatile latch element 10 of FIG. 1 in both its programmed and erased states. FIG. 2 illustrates the operation of the two-transistor, zero-power, electrically-alterable non-volatile latch element 10 as described above. As may be seen from an examination of FIG. 2, the solid line 30 represents the normal voltage transfer characteristic of a CMOS inverter. The dashed line 32 represents the current flow through the inverter as a function of the output voltage. The negative peak of the current flow curve represents the point at which both the P-Channel MOS transistor and the N-Channel MOS transistor are conducting.

The straight dashed line 34 in FIG. 2 represents the operating point of the inverter when electrons have been tunneled onto the floating gate by the programming operation. The output voltage is at a maximum and the current flow is zero. The straight dashed line 36 represents the operating point of the inverter when electrons have been tunneled off of the floating gate by the erase operation. The output voltage is at a minimum and the current flow is zero. Thus it may be seen that the two-transistor, zero-power, electrically-alterable non-volatile latch element 10 of the present invention exhibits no current flow in either its programmed or erased state.

Those of ordinary skill in the art will recognize that the two-transistor, zero-power, electrically-alterable, non-volatile latch element 10 structure of the present invention is a stable structure. Experience with floating gate transistor devices has shown that such devices reliably retain their floating gate charge for periods in excess of ten years.

The two-transistor, zero-power, electrically-alterable non-volatile latch element 10 structure of FIG. 1 may be used to drive a number of different devices. As will be disclosed herein, the latch of the present invention may be advantageously employed to drive a pass transistor whose state may be used to control the selective formation of interconnection nets in an integrated circuit.

Figure 3:
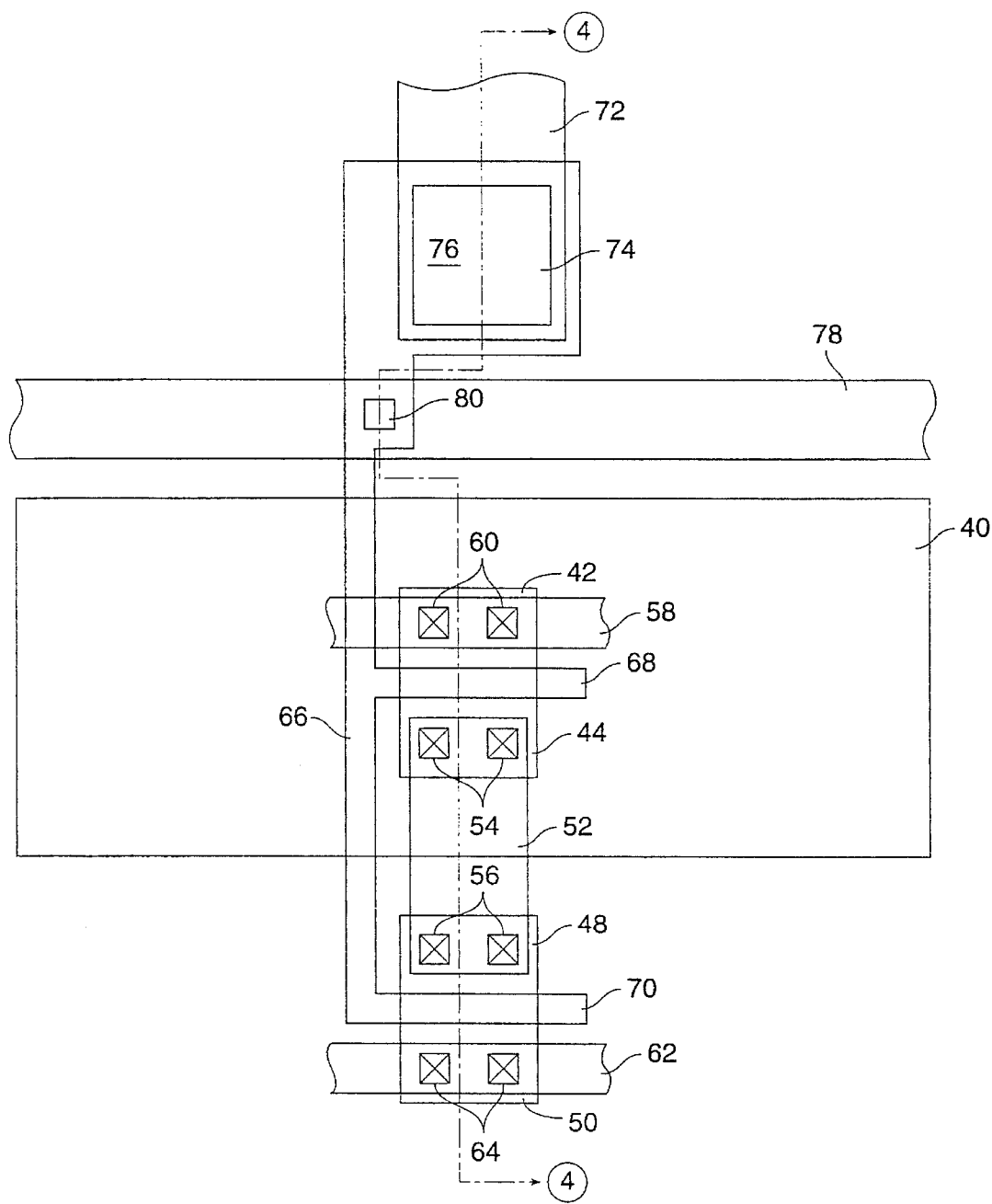
FIG. 3 is a top view of an illustrative semiconductor layout of the two-transistor, zero-power, electrically-alterable non-volatile latch element of FIG. 1.
Figure 4:
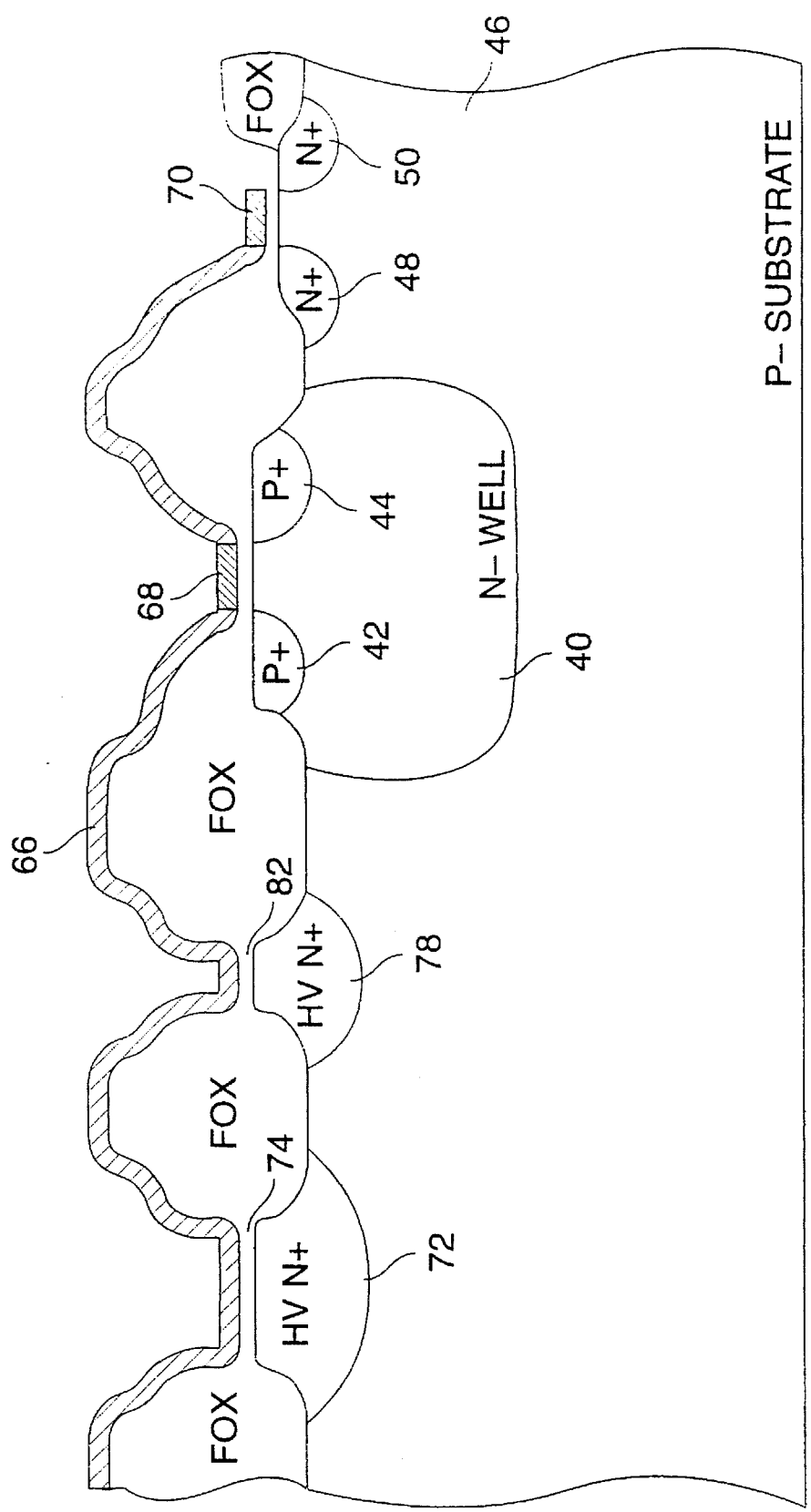
FIG. 4 is a cross-sectional view of the illustrative semiconductor layout of the two-transistor, zero-power, electrically-alterable non-volatile latch element of FIG. 3, taken through lines 4—4.

Referring now to FIGS. 3 and 4, an illustrative embodiment of the two-transistor, zero-power, electrically-alterable non-volatile latch element 10 of the present invention as embodied in semiconductor material is shown. FIG. 3 is a top view of an illustrative semiconductor layout of the two-transistor, zero-power, electrically-alterable non-volatile latch element 10 of FIG. 1. FIG. 4 is a cross-sectional view of the illustrative semiconductor layout of the two-transistor, zero-power, electrically-alterable non-volatile latch element of FIG. 3, taken through lines 4—4.

The P-Channel MOS transistor 12 of FIG. 1 is disposed in n-well 40 and its source and drain comprise p+ diffused regions 42 and 44, respectively. The N-Channel MOS transistor 14 of FIG. 1 is disposed in the p-type semiconductor substrate 46 (more easily seen in FIG. 4) and its drain and source regions comprise n+ diffused regions 48 and 50, respectively. Metal strip 52 is used to connect p+ diffused region 44 to n+ diffused region 48 via contacts 54 and 56. Vcc metal line 58 is connected to p+ diffusion region 42 via contacts 60 and ground metal line 62 is connected to n+diffusion region 50 via contacts 64. Those of ordinary skill in the art will observe that double contacts are shown in the layout of FIG. 3, but will realize that single contacts may be employed instead.

Floating gate 24 of FIG. 1 is formed from a single layer of polysilicon 66 having extending finger 68 disposed above the channel region between p+ diffused regions 42 and 44 forming the floating gate portion of P-Channel MOS transistor 12. A second extending finger 70 is disposed above the channel region between n+ diffused regions 48 and 50 forming the floating gate portion of N-Channel MOS transistor 14. As will be appreciated by those of ordinary skill in the art, the source and drain diffusions 42 and 44, and 48 and 50 for both the P-Channel and N-Channel MOS transistors 12 and 14 may be formed using self-aligned gate techniques as are known in the art.

The common control gate node 28 of P-Channel MOS transistor 12 and N-Channel MOS transistor 14 may be formed as a high-voltage n-type diffused region 72 in the p-type semiconductor substrate 46. High-voltage n-type diffused region 72 should be formed so as to withstand the contemplated Vpp voltage with an appropriate margin as is well understood in the art. The high-voltage n-type diffused region 72 is capacitively coupled to an enlarged portion of the overlying single layer of polysilicon 66 to enhance capacitive coupling. A dielectric layer 74, typically formed from high quality oxide as is known in the art, to a thickness of from about 50 to about 130 angstroms, preferably about 80 angstroms, separates the high-voltage n-type diffused region 72 from the single layer of polysilicon 66 and forms coupling capacitor 76. The area of a typical coupling capacitor 76 is about 7 to 10 times the area of the tunneling capacitor.

The erase gate node 26 of two-transistor, zero-power, electrically-alterable non-volatile latch element 10 of FIG. 1 is formed as a high-voltage n-type diffused region 78 in the p-type semiconductor substrate 46. As with high-voltage n-type diffused region 72, high-voltage n-type diffused region 78 should also be formed so as to withstand the contemplated Vpp voltage with an appropriate margin as is well understood in the art. A tunneling capacitor 80 is formed by the intersection of the high-voltage n-type diffused region 78 with the overlying single layer of polysilicon 66. The single layer of polysilicon 66 is separated from the high voltage n-type diffused region 78 by a tunneling dielectric layer 82 typically formed from high quality oxide as is known in the art, to a thickness of about 50 to about 130 angstroms, preferably about 80 angstroms. The area of a typical tunneling capacitor 80 is about the smallest feature size which can be printed using photolithography techniques, or may be formed by an overlap of the source/drain diffusion with the polysilicon floating gate.

Those of ordinary skill in the art will recognize that, while the embodiment illustrated in FIGS. 3 and 4 employs "gate" elements which are actually disposed in the substrate, high voltage n-type diffused regions 72 and 78 could easily be replaced by polysilicon lines formed in a second layer of polysilicon as is well-known in the EPROM and EEPROM art. Such structures are equivalent to the structures depicted in the figures herein and are thus intended to fall within the scope of the present invention.

In a typical embodiment of the present invention, the two-transistor, zero-power, electrically-alterable non-volatile latch elements 10 may be programmed and erased by a Vpp voltage in the range of about 10 to about 15 volts.

As may be seen from an examination of FIGS. 3 and 4, because the control and erase "gate" nodes 28 and 26 are formed from high voltage n-type diffused regions 72 and 78 in the p-type semiconductor substrate 46, the two-transistor, zero-power, electrically-alterable non-volatile latch element 10 of the present invention may be fabricated as a part of a conventional single-level polysilicon gate CMOS integrated circuit fabrication process. Such a process begins with the conventional steps for forming the n-wells, the field implant and field oxidation steps.

The high-voltage n-type diffused regions 78 and 72 comprising the erase gate and control gate nodes 26 and 28 are then formed in the p-type semiconductor substrate 46 using buried n+ mask and implant. Alternatively, the erase gate node 26 can also be formed in the n-type source/drain diffusion using known high-voltage techniques.

Next, a tunnel window is etched to expose the high-voltage n-type diffused region 78 comprising the global erase gate node 26 and the tunneling dielectric layer 82 is formed, preferably from high quality oxide, and is then defined in the tunnel window. The single layer of polysilicon 66 which will comprise the floating gate is then formed, doped and defined, using conventional semiconductor processing technology.

The gate oxide step for the formation of other P-Channel and N-Channel transistor devices on the integrated circuit is then performed, followed by deposition, doping, and definition of the polysilicon gates for those other transistor devices. If the global erase and control gate node 26 and 28 are to be formed from polysilicon layers, an inter-poly oxide is formed, windows are etched to expose regions of the floating gate, and the tunneling dielectric layer 82 and control gate capacitor dielectric layer 74 are formed prior to performing the gate poly deposition step. An implant oxide is formed, followed by the masking and implant steps necessary to form both the P-Channel and N-Channel self-aligned source and drain regions 42 and 44, and 48 and 50.

Next, BPSG deposition, contact window formation, and first level metal steps are performed using conventional semiconductor processing techniques. Subsequent metal layers and other back-end processing may then be performed as is well known in the art.

The details of the individual process steps used in the fabrication of the two-transistor, zero-power, electrically-alterable non-volatile latch element 1 0, such as times, temperatures, doses, thicknesses, etc., are well known in the art for formation of CMOS devices and have therefore not been recited herein. As will be recognized by persons of ordinary skill in the art, the process described herein for the fabrication of the two-transistor, zero-power, electrically-alterable non-volatile latch element 10 of the present invention may be practiced using standard CMOS processing steps, and employing conventional layer thicknesses, implant dosages, etc. The additional processing steps used to form the floating gate 24, tunneling dielectric layer 82, and coupling and tunneling capacitors 76 and 80 for the control and erase gate nodes 28 and 26 are well known in the EEPROM and EPROM art and are not repeated here in order to avoid overcomplicating the disclosure.

As may also be seen from an examination of FIGS. 3 and 4, the two-transistor, zero-power, electrically-alterable non-volatile latch element 10 of the present invention may be formed as a compact structure. The layout shown in FIGS. 3 and 4 readily lends itself to the layout of an array of two-transistor, zero-power, electrically-alterable non-volatile latch elements 10. Such an array could be usefully employed in devices such as user-programmable circuits (e.g., FPGA integrated circuits). The outputs of the two-transistor, zero-power, electrically-alterable non-volatile latch elements 10 would be used to drive transistor switches to selectively make interconnections in the user-programmable integrated circuits.

Figure 5:
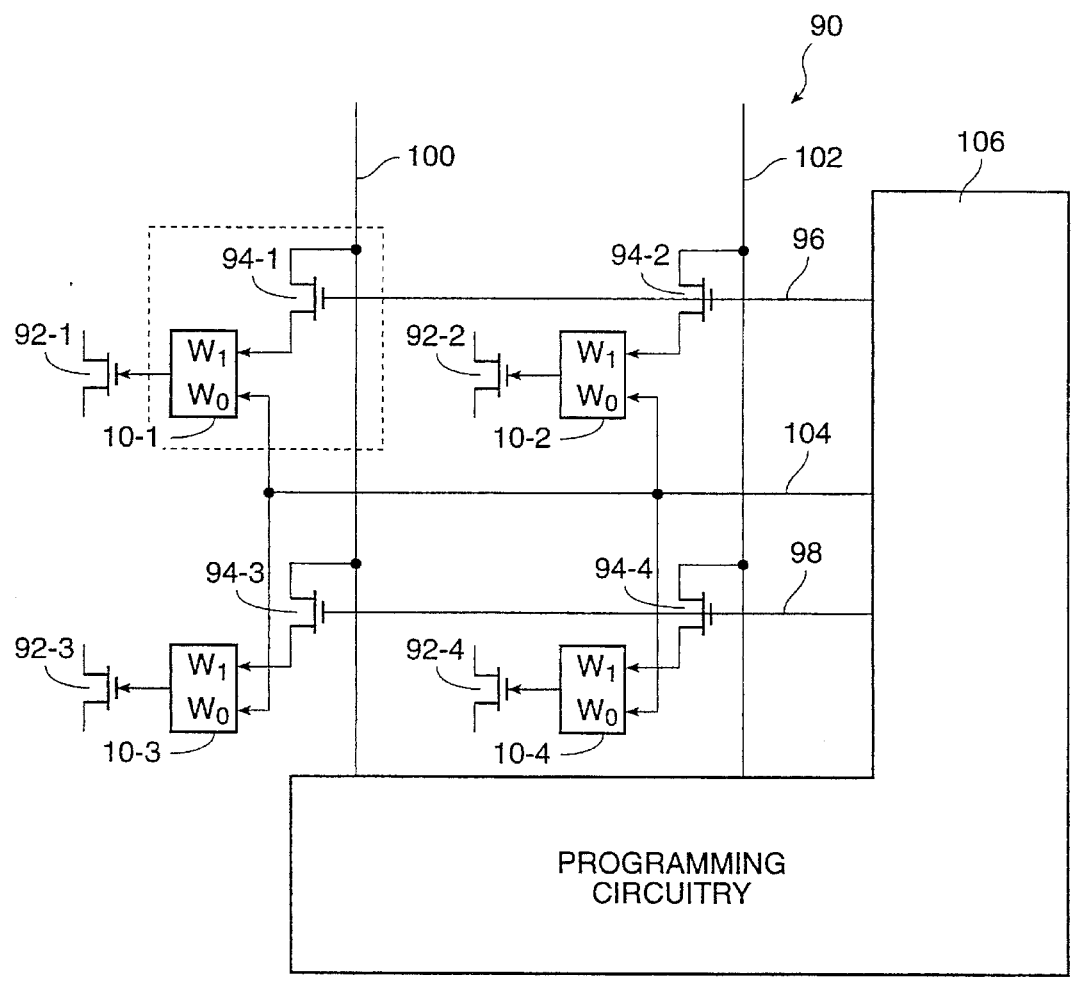
FIG. 5 is a schematic diagram of a two-by-two array of two-transistor, zero-power, electrically-alterable non-volatile latch elements according to another aspect of the present invention.

Such an array 90 of two-transistor, zero-power, electrically-alterable non-volatile latch elements is shown in FIG. 5 in schematic form according to another aspect of the present invention. The array 90 includes a plurality of two-transistor, zero-power, electrically-alterable non-volatile latch elements arranged in rows and columns. In FIG. 5, the two-transistor, zero-power, electrically-alterable non-volatile latch elements are shown as squares and designated with reference numerals 10-1, 10-2 10-3, and 10-4. Although the illustrative array 90 of FIG. 5 is shown comprising two rows and two columns, those of ordinary skill in the art will readily recognize that the array of FIG. 5 is for purposes of illustration and that much larger arrays are practical according to the present invention.

Two-transistor, zero-power, electrically-alterable non-volatile latch elements 10-1 and 10-2 form the first row of array 90 and two-transistor, zero-power, electrically-alterable non-volatile latch elements 10-3 and 10-4 form the second row of array 90. Similarly, two-transistor, zero-power, electrically-alterable non-volatile latch elements 10-1 and 10-3 form the first column of array 90 and two-transistor, zero-power, electrically-alterable non-volatile latch elements 10-2 and 10-4 form the second column of array 90.

Each two-transistor, zero-power, electrically-alterable non-volatile latch element 10-1 through 10-4 has associated with it a pass transistor. These pass transistors are labelled with reference numerals 92-1 through 92-4, the numeric suffixes corresponding to the numeric suffixes of the two-transistor, zero-power, electrically-alterable non-volatile latch element 10-1 through 10-4 with which each pass transistor 92-1 through 92-4 is associated. The gate of each pass transistor 92-1 through 92-4 is connected to the output node of its associated two-transistor, zero-power, electrically-alterable non-volatile latch element 10-1 through 10-4. As illustrated in FIG. 5, pass transistors 92-1 through 92-4 are shown as N-Channel MOS transistors, but those of ordinary skill in the art will recognize that other types of devices may be used for different applications without departing from the principles of the present invention.

The individual two-transistor, zero-power, electrically-alterable non-volatile latch elements 10-1 through 10-4 in the array 90 of the present invention may be addressed and programmed or may be erased. In the configuration of the array depicted in FIG. 5, a global erase mode is provided, although those of ordinary skill in the art will easily understand how to configure an array in which the two-transistor, zero-power, electrically-alterable non-volatile latch elements 10-1 through 10-4 could be individually erased.

In the array 90 of the present invention, select transistors 94-1 through 94-4 are used to select the individual two-transistor, zero-power, electrically-alterable non-volatile latch elements 10-1 through 10-4 for programming. As with the pass transistors 92-1 through 92-4, the numeric suffixes of the select transistors 94-1 through 94-4 in FIG. 5 correspond to the numeric suffixes of the two-transistor, zero-power, electrically-alterable non-volatile latch element 10-1 through 10-4 with which each pass transistor 92-1 through 92-4 is associated. The select transistors 94-1 through 94-4 are used to deliver the programming voltage to selected ones of the two-transistor, zero-power, electrically-alterable non-volatile latch elements 10-1 through 10-4 to program them.

The gates of select transistors 94-1 and 94-2 are connected to a first row line 96. The gates of select transistors 94-3 and 94-4 are connected to a second row line 98. The drains of select transistors 94-1 and 94-3 are connected to a first column line 100. The drains of select transistors 94-2 and 94-4 are connected to a second column line 102. The source of each of the select transistors 94-1 through 94-4 is connected to the input node (the common control gate node 28) of its corresponding two-transistor, zero-power, electrically-alterable non-volatile latch element 10-1 through 10-4.

Global erase line 104 is shown connected to each of the two-transistor, zero-power, electrically-alterable non-volatile latch element 10-1 through 10-4. The global erase line 104 is connected to the erase gate node 26 of each of the two-transistor, zero-power, electrically-alterable non-volatile latch elements 10-1 through 10-4 and is used to erase or reset all of the two-transistor, zero-power, electrically-alterable non-volatile latch elements 10-1 through 10-4 simultaneously.

During the operating mode of the array 90 of the present invention, the first and second row lines 96 and 98 are kept at zero volts so that select transistors 94-1 through 94-4 are turned off. When it is desired to program one of the two-transistor, zero-power, electrically-alterable non-volatile latch elements 10-1 through 10-4 of the array 90, the first and second row lines 96 and 98 and the first and second column lines 100 and 102 are used to select the two-transistor, zero-power, electrically-alterable non-volatile latch elements 10-1 through 10-4 to be programmed and to deliver them appropriate voltages to the selected two-transistor, zero-power, electrically-alterable non-volatile latch.

To program one or more desired two-transistor, zero-power, electrically-alterable non-volatile latch elements 10-1 through 10-4, it is first advisable, but not necessary to erase all of the two-transistor, zero-power, electrically-alterable non-volatile latch elements 10-1 through 10-4 in order to set them all to a known state. This is done by connecting first and second column lines 102 and 104 to ground, turning on all select transistors 94-1 through 94-4 to place ground on the common control gate nodes 28 of the N-Channel and P-Channel MOS transistors, and by applying the programming voltage Vpp to the global erase line 104. As described previously for a single two-transistor, zero-power, electrically-alterable non-volatile latch element 10 example, this action will cause electrons to tunnel from the floating gates 24 of all of the two-transistor, zero-power, electrically-alterable non-volatile latch elements 10-1 through 10-4, thus rendering them more positive. After erasing, all of the N-Channel MOS transistors 14 (FIG. 1) in the individual two-transistor, zero-power, electrically-alterable non-volatile latch elements 10-1 through 10-4 will be turned on and all of the P-Channel MOS transistors 12 (FIG. 1) will be turned off. The outputs of all of the two-transistor, zero-power, electrically-alterable non-volatile latch elements 10-1 through 10-4 will go to ground.

Once all of the two-transistor, zero-power, electrically-alterable non-volatile latch elements 10-1 through 10-4 are placed in a known state (erased), any one or more of the two-transistor, zero-power, electrically-alterable non-volatile latch elements 10-1 through 10-4 may be programmed. Using the example of programming two-transistor, zero-power, electrically-alterable non-volatile latch element 10-3, second row line 98 is brought to Vpp while first row line 96 is kept grounded. Vpp is also placed on first column line 100 while second column line 102 is kept grounded. The global erase line 104 is also kept grounded. This action turns on select transistor 94-3, placing Vpp on the common control gate node 28 of the N-Channel and P-Channel MOS transistors in two-transistor, zero-power, electrically-alterable non-volatile latch element 10-3. Under these conditions, electrons are caused to tunnel onto the floating gate 24 inside of two-transistor, zero-power, electrically-alterable non-volatile latch element 10-3, shifting the thresholds of the N-Channel and P-Channel MOS transistors in two-transistor, zero-power, electrically-alterable non-volatile latch element 10-3 such that the P-Channel MOS transistor is turned on and the N-Channel MOS transistor is turned off, causing the output of two-transistor, zero-power, electrically-alterable non-volatile latch element 10-3 to rise to a voltage of approximately Vcc.

Because first row line 96 is held at ground, both select transistors 94-1 and 94-2 are turned off. Because second column line 102 is held at ground, Vpp does not appear at the control gate node 28 of the transistors in two-transistor, zero-power, electrically-alterable non-volatile latch element 10-4 even though the gate of select transistor 94-4 is at a voltage which would turn it on if there was any voltage at its drain. Thus, no tunneling of electrons will occur onto the floating gates of two-transistor, zero-power, electrically-alterable non-volatile latch elements 10-1, 10-2, and 10-4.

The driving of the various voltages onto first and second row lines, first and second column lines and global erase line 96, 98, 100, 102, and 104, respectively, is provided by programming circuitry 106. Circuitry for generating and switching the necessary voltages for programming the devices of the present invention is well known in the art and is a matter of simple design choice. The voltages may be generated on-chip by charge pumps as is known in the art or may be supplied from off chip via selected I/O pins as is well known in the art.

The two-transistor, zero-power, electrically-alterable non-volatile latch element 10 of the present invention will always power up to a desired state once it has been pre-programmed. Unlike some of the prior art latch elements, it employs independent read and write paths, thus minimizing the read disturb problem. It does not require high-voltage n-well technology. It employs a small cell size, making it an excellent candidate for array applications, and enjoys excellent long-term data retention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A two-transistor, zero-power, electrically-alterable non-volatile latch element comprising:

an input node;

an output node;

an erase node;

a P-Channel MOS transistor having a source connected to a source of a first electrical potential, a drain connected to said output node, a control gate connected to said input node, and a floating gate capacitively coupled to said control gate;

an N-Channel MOS transistor having a source connected to a source of a second electrical potential lower than said first electrical potential, a drain connected to said output node, a control gate connected to said input node, and a floating gate capacitively coupled to said control gate and common to said floating gate of said P-Channel MOS transistor;

said floating gates of said P-Channel MOS transistor and said N-Channel MOS transistor capacitively coupled to said erase node via a tunnel dielectric.

2. The two-transistor, zero-power, electrically-alterable non-volatile latch element of claim 1, further including a MOS transistor having a drain, a source, and a gate, said gate connected to said output node.

3. An array of two-transistor, zero-power, electrically-alterable non-volatile latch elements comprising:

a row line for each row in said array;

a column line for each column in said array, each column line forming an intersection with each row line in said array;

a plurality of two-transistor, zero-power, electrically-alterable non-volatile latch elements arranged in array of rows and columns, each of said two-transistor, zero-power, electrically-alterable non-volatile latch elements disposed at one of said intersections and comprising an input node, an output node, an erase node, a P-Channel MOS transistor having a source connected to a source of a first electrical potential, a drain connected to said output node, a control gate connected to said input node, and a floating gate capacitively coupled to said control gate, an N-Channel MOS transistor having a source connected to a source of a second electrical potential lower than said first electrical potential, a drain connected to said output node, a control gate connected to said input node, and a floating gate capacitively coupled to said control gate and common to said floating gate of said P-Channel MOS transistor, said floating gates of said P-Channel MOS transistor and said N-Channel MOS transistor capacitively coupled to said erase node via a tunnel dielectric, and a select transistor, each of said select transistors having, a source, source connected to said input node, a drain connected to the one of said column lines associated with its intersection, and a gate connected to the one of said row lines associated with its intersection;

common erase line connected to the erase node of each of said two-transistor, zero-power, electrically-alterable non-volatile latch element in said array;

circuitry for selectively connecting each of said row lines to a voltage selected from ground and Vpp; and circuitry for selectively connecting each of said column lines to a voltage selected from ground and Vpp.

\* \* \* \* \*